United States Patent [19]
Krishnaswamy et al.

[11] Patent Number: 5,185,589
[45] Date of Patent: Feb. 9, 1993

[54] MICROWAVE FILM BULK ACOUSTIC RESONATOR AND MANIFOLDED FILTER BANK

[75] Inventors: S. Visvanathan Krishnaswamy, Monroeville, Pa.; Stuart S. Horwitz, Randallstown; Robert A. Moore, Arnold, both of Md.

[73] Assignee: Westinghouse Electric Corp., Pittsburgh, Pa.

[21] Appl. No.: 702,647

[22] Filed: May 17, 1991

[51] Int. Cl.⁵ .................. H03H 9/70; H03H 9/205; H03H 9/56
[52] U.S. Cl. .................. 333/133; 333/191; 310/320; 310/324
[58] Field of Search .................. 333/187-192, 333/133; 310/320, 324, 366

[56] References Cited

FOREIGN PATENT DOCUMENTS

| 156220 | 9/1983 | Japan | 333/191 |
| 4315 | 1/1986 | Japan | 333/191 |
| 174417 | 7/1988 | Japan | 333/187 |

OTHER PUBLICATIONS

*SBAR Filter Monolithically Integrated with HBT Amplifier*, D. Cushman, K. F. Lau, E. M. Garber, K. A. Mai, A. K. Oki, K. W. Kobayashi, Dec. 1990 IEEE Ultrasonics Symposium.

*Film Bulk Acoustic Resonator Technology*, S. V. Krishnaswamy, J. Rosenbaum, S. Horwitz, C. Vale, R. A. Moore, Dec. 1990 IEEE Ultrasonics Symposium.

Primary Examiner—Paul M. Dzierzynski
Assistant Examiner—Benny T. Lee
Attorney, Agent, or Firm—David G. Maire

[57] ABSTRACT

A film bulk acoustic resonator (FBAR) configured as a coplanar transmission line structure. A film resonator formed over an opening in a substrate is connected to associated circuitry by one or more transmission lines formed on the substrate. The coplanar ground plane of this structure provides a simple mechanism for providing a true ground connection to the resonator without the need for vias passing through the substrate. The transmission line connection eliminates the need for wirebonds, thus simplifying fabrication, allowing the device to be more easily modified for computer simulation, and facilitating the operation of the device at microwave frequencies. Embodiments for standard, stacked, and 3-port FBAR's as well as a filter bank consisting of a plurality of coplanar 3-port FBAR's, are described.

12 Claims, 8 Drawing Sheets

MICROWAVE FILM BULK ACOUSTIC RESONATOR AND MANIFOLDED FILTER BANK

BACKGROUND OF THE INVENTION

This invention relates to the field of film bulk acoustic resonators (FBAR), and in particular to FBAR's operable at microwave frequencies.

FBAR's are fabricated by sputter deposition of piezoelectric material, typically ZnO or AlN, on to a thin membrane formed on a semiconductor substrate. The combination of the piezoelectric layer and thin membrane forms an acoustic structure which is resonant at a specific frequency. A ZnO film having a thickness of a few microns will yield a resonator with a fundamental frequency of around 500 MHz.

A simple FBAR is illustrated in FIG. 1A, where a thin membrane of silicon dioxide 1 spans an opening in a semiconductor substrate 2. A layer of piezoelectric material 5 is disposed between input and output electrodes 7 and 9 respectively. Electrically, this device can be represented by the equivalent circuit shown in FIG. 1B, where $L_m$, $R_m$, and $C_m$ are motional parameters similar to those used with quartz crystals, and $C_o$ is the interelectrode capacitance. When this device is used as a series element in a filter, the interelectrode capacitance limits the attainable bandwidth. The interelectrode capacitance permits unwanted high-pass response, and when a parallel inductor is used as a neutralizing element, the parallel inductor permits an unwanted low-pass response.

An alternate structure which has none of these characteristics, and thus has the potential of higher frequency broadband operation, is the stacked FBAR, shown in FIG. 2A. The stacked FBAR is formed by adding a second layer of piezoelectric material to the standard FBAR, and by including a shield electrode. In FIG. 2A, a thin membrane of insulating material 20 spans an opening in a semiconductor substrate 22. In this device, input and output electrodes, 23 and 24 respectively, are separated by two layers of piezoelectric material, 25 and 26, and a shield electrode 27. Acoustically, this is essentially the same device as the standard FBAR of FIG. 1A, although an additional level of electromechanical coupling has been added. In this device, the shield electrode is connected to ground, providing isolation between the input and output electrodes, thereby essentially removing the interelectrode capacitance from consideration in filter design. This device is represented by the equivalent circuit shown in FIG. 2B, which utilizes the same symbology as FIG. 1B. When used as a series element in a filter, the stacked FBAR provides a true bandpass response.

Prior art FBAR devices are coupled to their associated circuitry by means of contact pads and wire bonds. This technique provides a poorly defined ground connection, because the inductance of the lead length lifts the actual ground away from true ground potential. While such prior art devices are adequate for lower frequencies applications, as the frequency climbs beyond 1 GHz, they rapidly become inoperable. A further disadvantage of the prior art devices is that the unwieldy transitions associated with the wire bond connections make simulation and computer analysis extremely difficult.

SUMMARY OF THE INVENTION

In light of the limitations of the prior art devices, it is an object of this invention to describe an FBAR device which is operable at microwave frequencies, which is more easily modeled for computer simulation, which is totally monolithic, and which eliminates the need for wire bond connections.

Disclosed herein is a film bulk acoustic resonator configured as a coplanar transmission line structure. A film resonator, formed over an opening in a substrate, is connected to associated circuitry by means of a transmission line surrounded by a coplanar ground plane. The coplanar transmission line configuration eliminates the need for wirebond connections and it supplies a true ground connection to the resonator without the need for vias through the substrate material. Standard, stacked, and 3-port FBAR's may be configured in this manner. A monolithic filter bank operable at microwave frequencies can be constructed as an interconnected plurality of 3-port FBAR's incorporating this invention.

DESCRIPTION OF THE INVENTION

This invention is a film bulk acoustic resonator (FBAR) which is configured as a coplanar transmission line structure. The use of a coplanar transmission line structure provides a simple means for grounding and shielding the resonator structure. Furthermore, an FBAR configured in this manner requires no wire bond connections to the resonator, and is therefore more easily modeled for computer simulation. The invention facilitates the fabrication of monolithic FBAR's operable at microwave frequencies.

Figure 3:
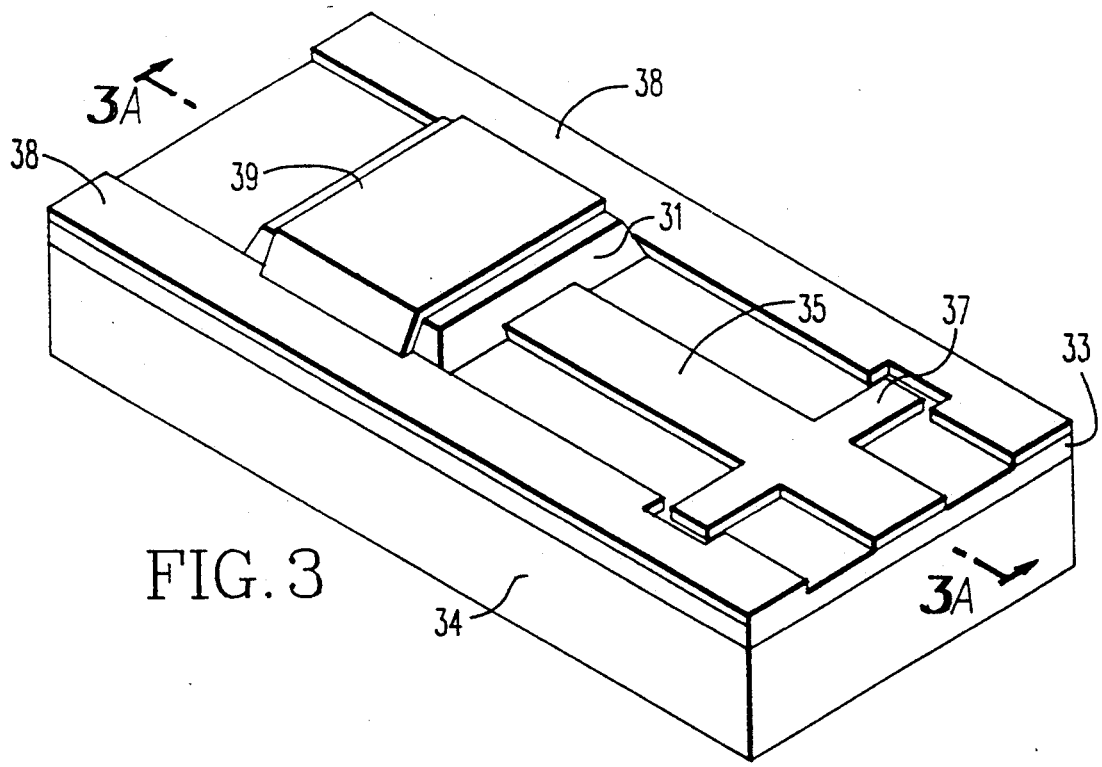
FIG. 3 is a perspective view of an FBAR configured as a coplanar transmission line structure in accordance with this invention.
Figure 3A:
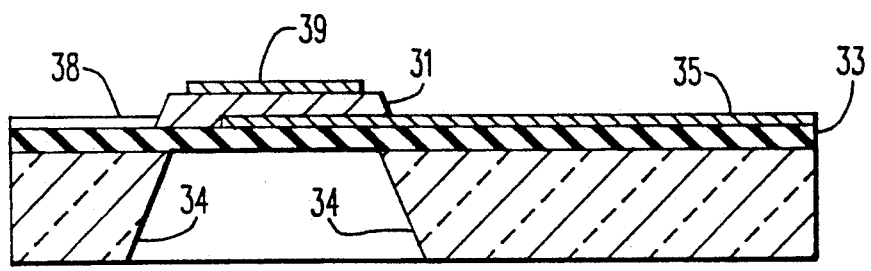
FIGS. 3A and 3B are cross-sectional views of alternative embodiments of the device of FIG. 3 as viewed along Section A—A.

An embodiment of this invention for a standard FBAR structure is shown in FIGS. 3 and 3A, where like structures are numbered consistently. A piezoelectric layer 31 is disposed on an insulating layer 33 which spans an opening in a substrate 34. An input electrode 35, formed on the insulating layer 33, is configured as a transmission line, having one end positioned above the opening in the substrate 34. The transmission line 35 extends to connect with associated circuitry such as shunt inductor 37 (see FIG. 3). A ground plane 38 is formed on the insulating layer 33 adjacent to the FBAR and coplanar with the input transmission line 35, with one portion extending over the piezoelectric layer to form an output electrode 39. In this configuration, the FBAR will function as a shunt element providing a bandstop device. This invention eliminates the need for a separate ground connection for the output electrode which otherwise would have to pass through the substrate as a via, and it provides a true ground to the output of the resonator.

Figure 3B:
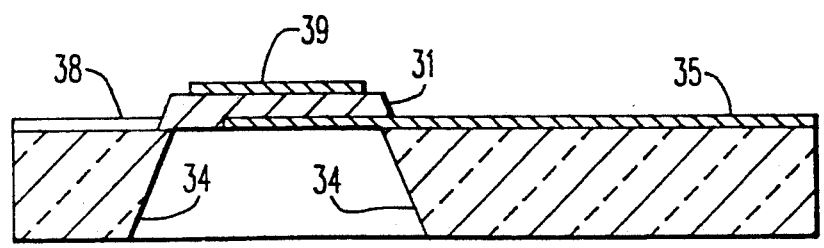

FIG. 3B illustrates the device of FIG. 3, again with like structures numbered consistently, but constructed without an insulating layer. In FIG. 3B the piezoelectric layer 31 and input transmission line 35 are formed directly onto the substrate 34, which in this case has insulating properties.

Figure 4:
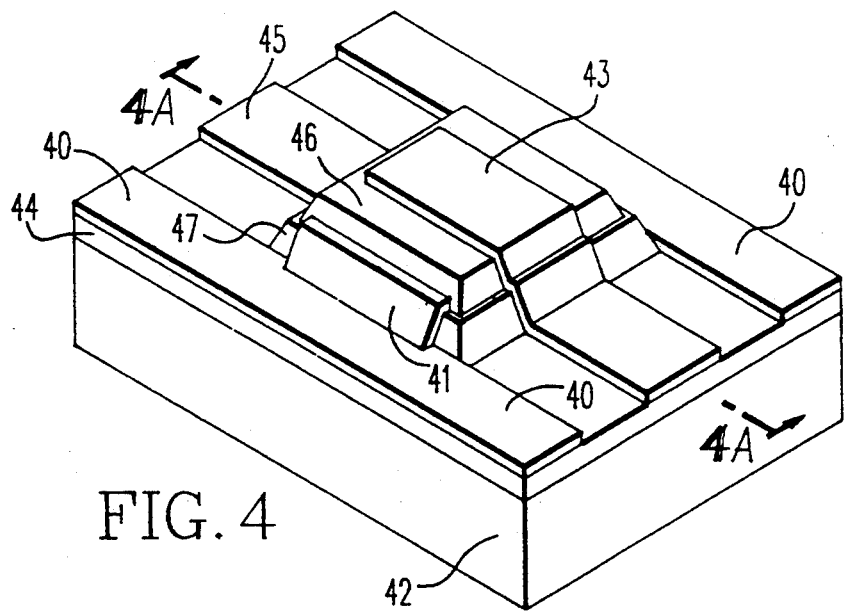
FIG. 4 is a perspective view of a stacked FBAR configured as a coplanar transmission line structure in accordance with this invention.
Figure 4A:
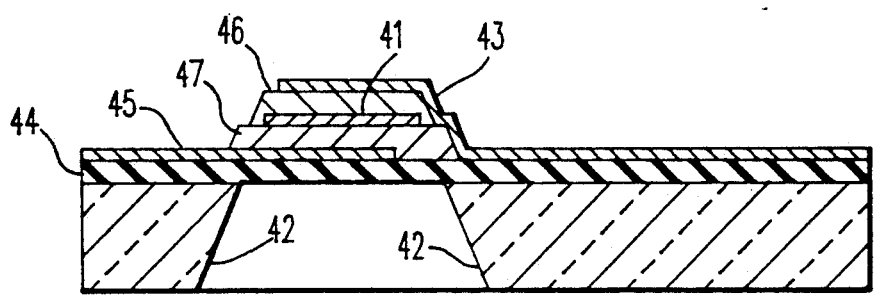
FIGS. 4A and 4B are cross-sectional views of alternative embodiments of the device of FIG. 4 as viewed along Section A—A.

An embodiment of this invention for a stacked FBAR is shown in FIGS. 4 and 4A, where like structures are numbered consistently. A top piezoelectric layer 46 is separated from a bottom piezoelectric layer 47 by a shielding layer 41. This resonating structure is disposed on an insulating layer 44, and it is located over an opening in a semiconductor substrate 42. Top electrode 43 and bottom electrode 45 are formed as transmission lines, each having one end on its respective piezoelectric layer, and each having a section extending along the top surface of the insulating layer 44. A ground plane 40 (see FIG. 4) is formed on the insulating layer 44 adjacent to the resonator structure and surrounding the transmission lines 43 and 45, with one section extended to form the shielding layer 41. The transmission lines 43 and 45 can be extended to connect with associated circuitry (not shown) also formed on the insulating layer 44 or substrate 42. Using the ground plane as the shielding layer in this embodiment eliminates the need for a separate ground connection for the shield which otherwise would have to pass through the substrate.

Figure 4B:
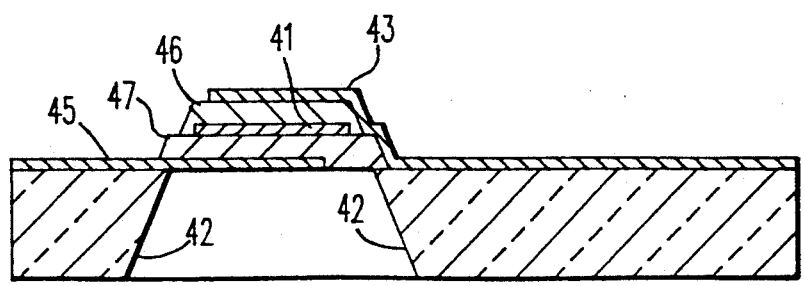

FIG. 4B illustrates the device of FIG. 4 viewed along Section A—A again with like structures numbered consistently, but constructed without an insulating layer. In FIG. 4B, the bottom piezoelectric layer 47 and input transmission line 45 are formed directly onto substrate 42, which in this case has insulating properties.

Figure 5:
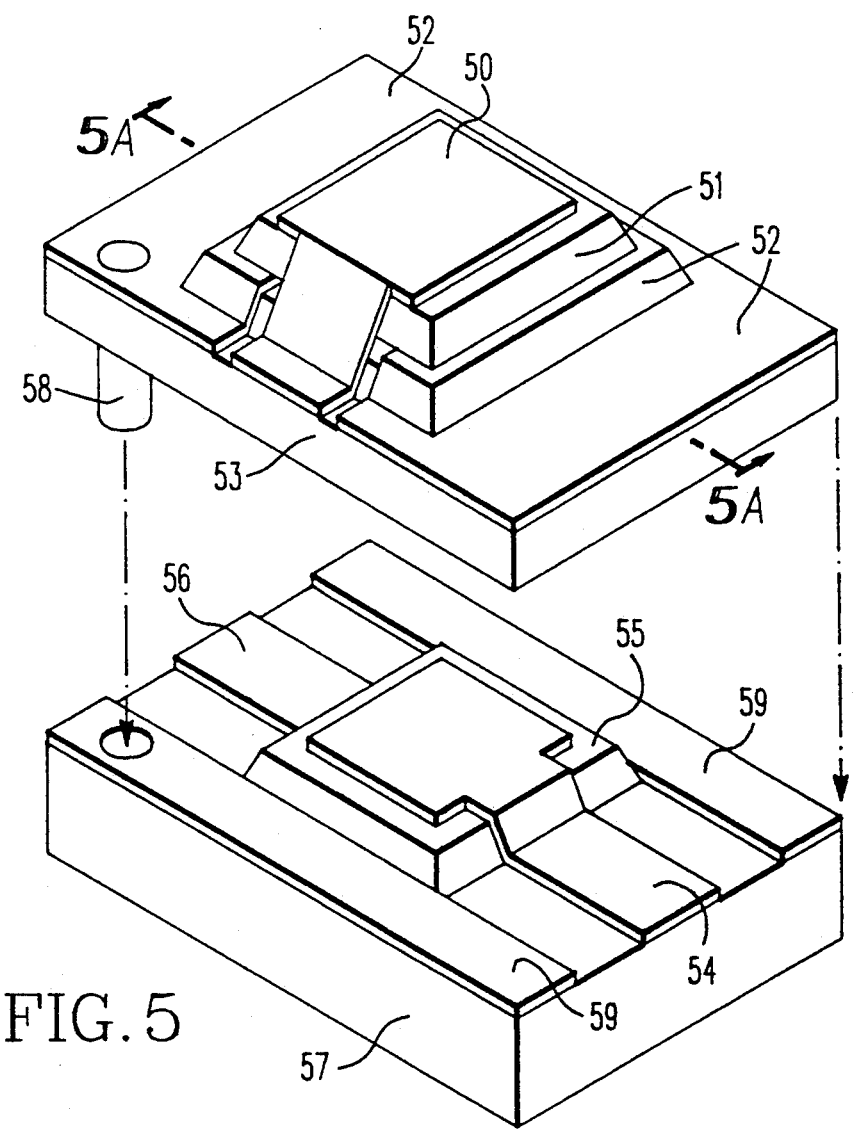
FIG. 5 is a perspective view of a 3-port FBAR configured as a coplanar transmission line structure in accordance with this invention.
Figure 5A:
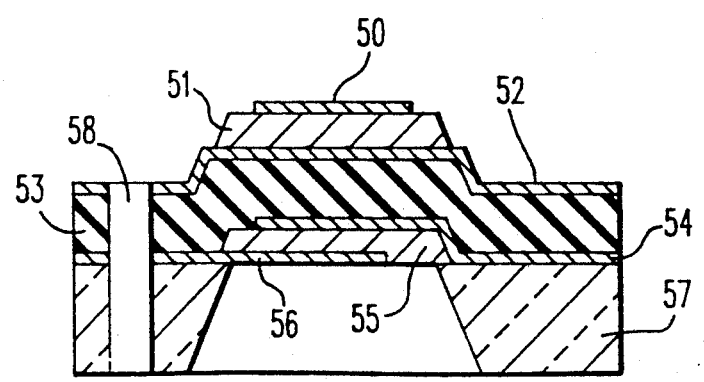
FIG. 5A is a cross-sectional view of the FBAR of FIG. 5 as viewed along section A—A.

Another embodiment of this invention is shown in FIGS. 5 and 5A, which depict a 3-port FBAR configured as a coplanar transmission line structure. FIG. 5A shows a cross sectional view of the device of FIG. 5, as viewed along section A—A, with like numerals depicting like structures in the two figures. Referring now to both FIGS. 5 and 5A, an insulating membrane 53, such as silicon dioxide, is formed between a top piezoelectric layer 51 and a bottom piezoelectric layer 55, which, in turn, spans an opening in substrate 57. A first transmission line 50 is formed on insulating membrane 53, with one end extending onto the top of piezoelectric layer 51 and continuing beyond the resonator structure to associated circuitry (not shown). A conductive layer 52 is formed on the top surface of the insulating membrane 53, providing a coplanar ground plane for transmission line 50. A transmission line 54 is formed on substrate 57, with one end extending over bottom piezoelectric layer 55. Transmission line 54 has its coplanar ground plane formed by a conductive layer 59 formed on the top of the substrate 57 ( see FIG. 5). Transmission line 56 is also formed on substrate 57, and is also surrounded and shielded by conductive layer 59. This transmission line 56 has one end located under the bottom piezoelectric layer 55 above an opening in substrate 57.

The device of FIGS. 5 and 5A is basically a stacked FBAR with the sequence of the layers altered, and an additional metal layer included. By separating the piezoelectric layers with an insulating membrane, a degree of electrical isolation is achieved.

A common problem in coplanar transmission lines is the need for bond wires connecting the ground planes at regular intervals to maintain equal potential on opposing portions of the ground plane. The design of the 3-port device of FIGS. 5 and 5A provides this capability with little additional effort. Referring to FIG. 5, there are actually two ground planes, conductive layer 52 and conductive layer 59. Since transmission line 50 is at right angles to transmission lines 54 and 56, the ground plane continuity can be conveniently achieved by providing a via 58 at appropriate points. The thickness of the insulating membrane 53 in a typical resonator is on the order of several microns, as compared to a typical substrate thickness of 15 mils. Therefore, fabrication of vias 58 is much simpler than providing vias through the substrate 57 or providing wire bond connections as in the prior art.

Figure 1A:
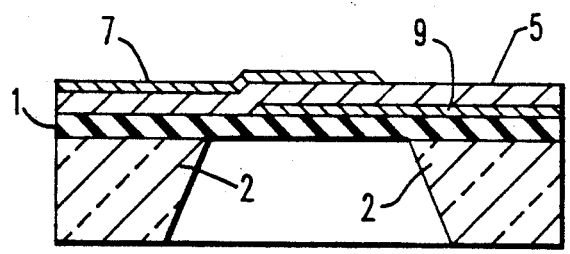
FIG. 1A is a cross-sectional view of a prior art FBAR.
Figure 2A:
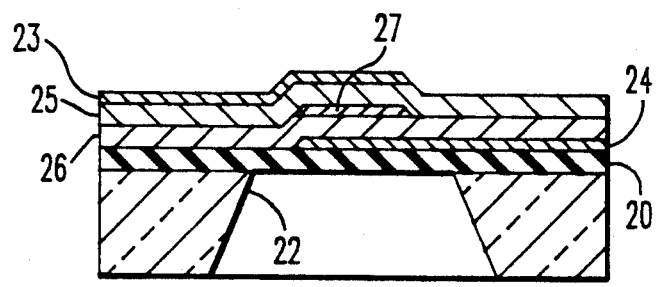
FIG. 2A is a cross-sectional view of a prior art stacked FBAR.
Figure 1B:
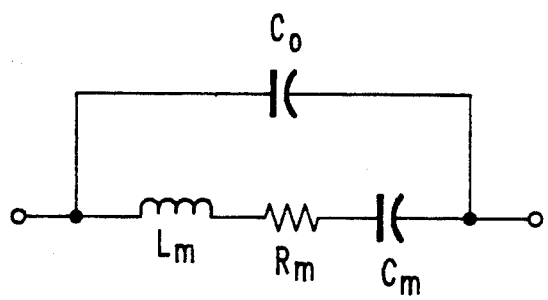
FIG. 1B is an equivalent circuit for the prior art device of FIG. 1A.
Figure 2B:
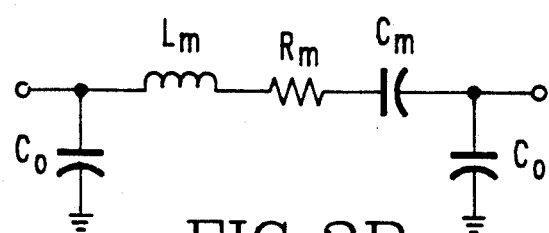
FIG. 2B is an equivalent circuit for the prior art device of FIG. 2A.
Figure 6:
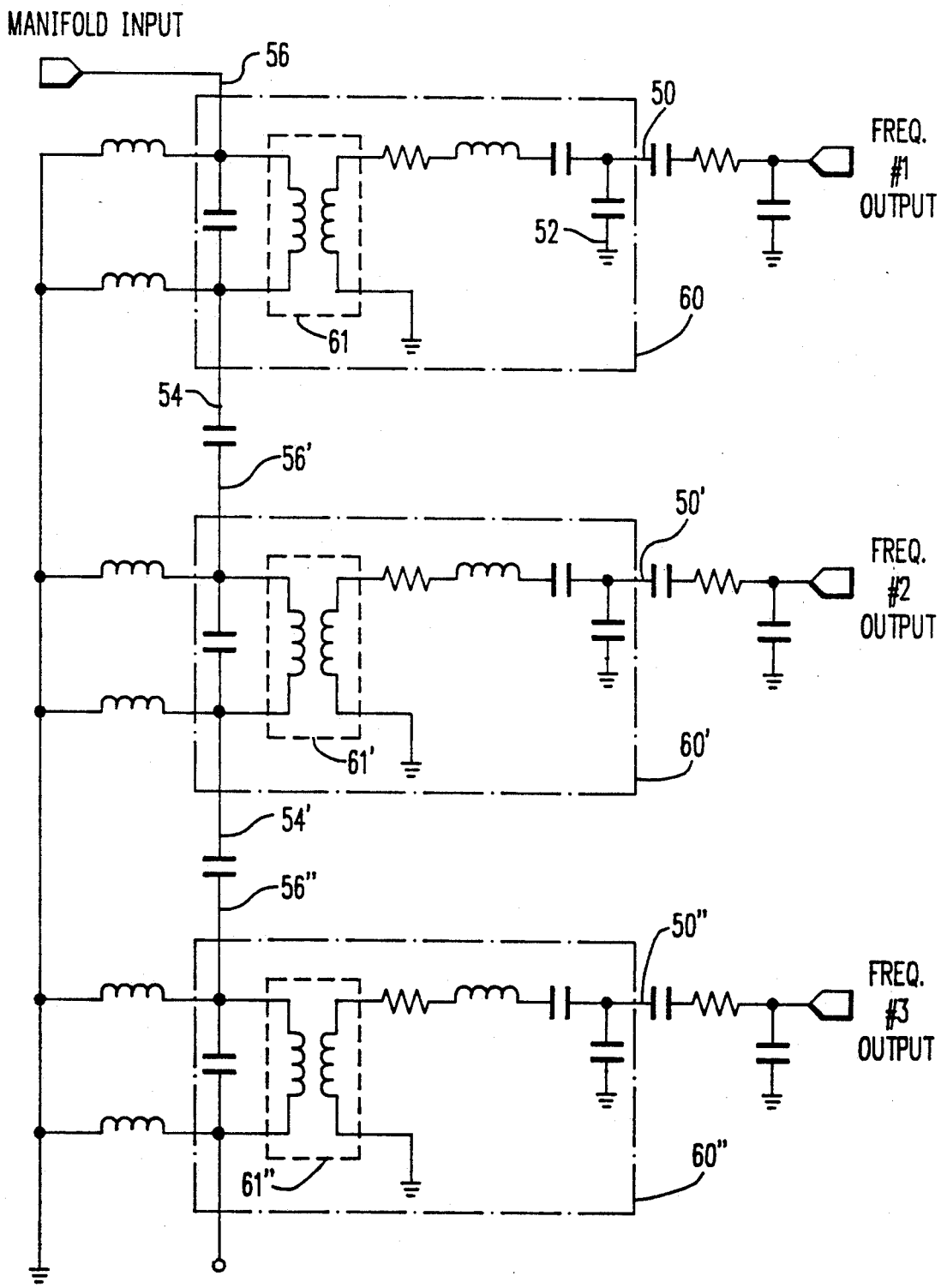
FIG. 6 illustrates a filter bank consisting of three 3-port FBAR's in accordance with this invention.
Figure 7:
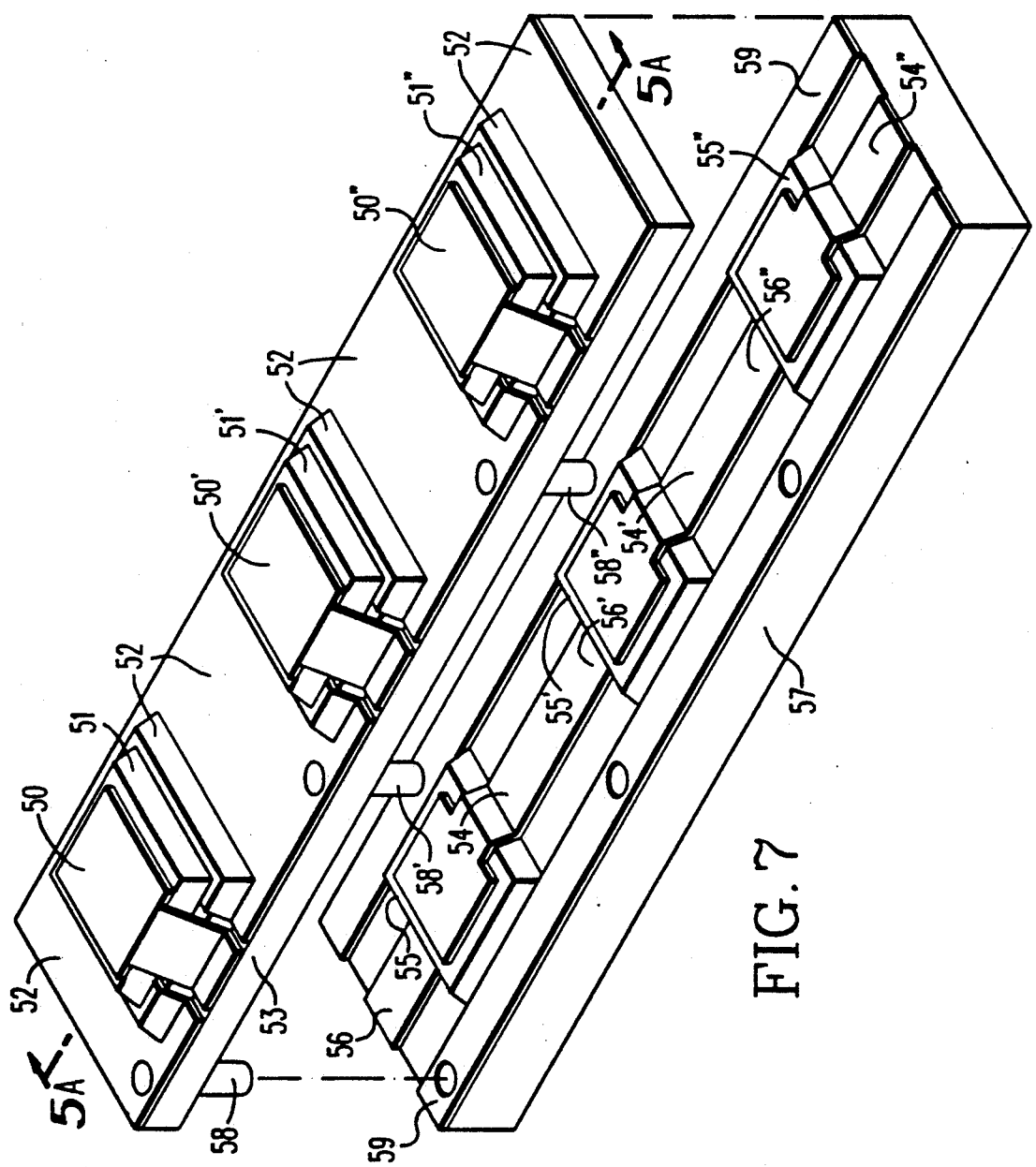
FIG. 7 is a perspective view of a filter bank containing three 3-port FBARs configured as coplanar transmission line structures in accordance with this invention.
Figure 7A:
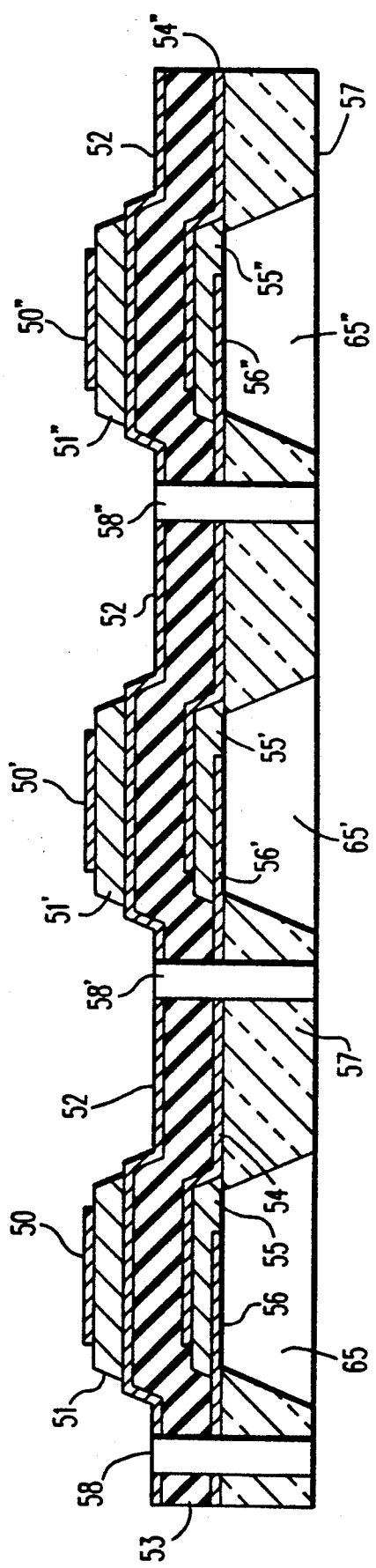
FIG. 7A is a cross-sectional view of the filter bank of FIG. 7 as viewed along section A—A.

The value of the capacitance between transmission lines 54 and 56 is much less than the capacitance between transmission lines 50 and 54 or 50 and 56. This makes it possible to design a series manifold circuit in which the capacitance between transmission lines 54 and 56 is included in the series element. FIGS. 7 and 7A illustrate a filter bank using this technique wherein the FBAR capacitance is used as the series element in a lumped circuit approximation of a transmission line. FIG. 6 is the circuit diagram for a filter bank using the device of FIGS. 7 and 7A, and equivalent elements are numbered consistently among these figures. FIG. 6 shows a series manifold filter circuit containing three interconnected 3-port FBAR's 60, 60', and 60". An input signal provided to the manifold input will be divided into its component parts and output at the respective frequency outputs #1, #2 and #3. FIG. 7 illustrates three interconnected 3-port FBARs formed on a substrate 57, where insulating membrane 53 is formed between top piezoelectric layers 51, 51', 51" and respective bottom piezoelectric layers 55, 55', 55". First transmission lines 50, 50', 50" are formed on insulating membrane 53, with one end extending onto the top of respective piezoelectric layers 51, 51', 51". A conductive layer 52 is formed on the top surface of the insulating membrane 53, providing a coplanar ground plane for transmission lines 50, 50', 50". Transmission lines 54, 54', 54" are formed on substrate 57, with one end extending over bottom piezoelectric layer 55, 55', 55" respectively. Transmission lines 54, 54', 54" have their coplanar ground plane formed by a conductive layer 59 formed on the top of the substrate 57. Transmission lines 56, 56', 56" are also formed on substrate 57 and are also surrounded and shielded by conductive layer 59. Transmission lines 56, 56', 56" have one end located under the respective bottom piezoelectric layers 55, 55', 55" and above openings in substrate 57, as shown in FIG. 7A. Vias 58, 58', 58" connect conducting layers 52 and 59. The equivalent circuit for each 3-port FBAR is shown in FIG. 6. Note that the degree of electrical isolation provided by the insulating membrane is represented by transformers 61, 61' and 61". Other elements illustrated in FIG. 6 incorporate the symbology utilized in FIGS. 1B and 2B. Circuit connections 50, 52, 54, and 56 correspond to identically numbered elements in FIGS. 7 and 7A. Equivalent connections on FBAR's 60, 60' and 60" are numbered similarly, such as 50, 50', and 50". The filter of FIG. 6 is easily fabricated by utilizing 3-port FBAR's configured as coplanar transmission line structures, since the connections between the resonators, e.g. 54/56' and 54'/56", can be fabricated as a single coplanar transmission line surrounded by a common ground plane 59 on a common substrate, where the substrate has a plurality of openings 65, 65', 65" (see FIG. 7A) positioned under the resonators. This device can be used as a shunt element if desired, or it could be used in a series-shunt combination. With the proper choice of element values, it is possible to design a contiguous filter bank with no inherent manifolding loss.

All of the above embodiments of this invention can be fabricated using deposition, etching and masking techniques which are well known in the art, and therefore are not recited herein. The materials of construction are also known in the art, for example: AlN or ZnO piezoelectric materials; silicon, gallium arsenide or Microx (a trademark of Westinghouse Electric Corporation) substrates; silicon dioxide insulating layers and membranes; and gold, or CrAm, or aluminum contact materials for transmission lines and ground planes.

Figure 8:
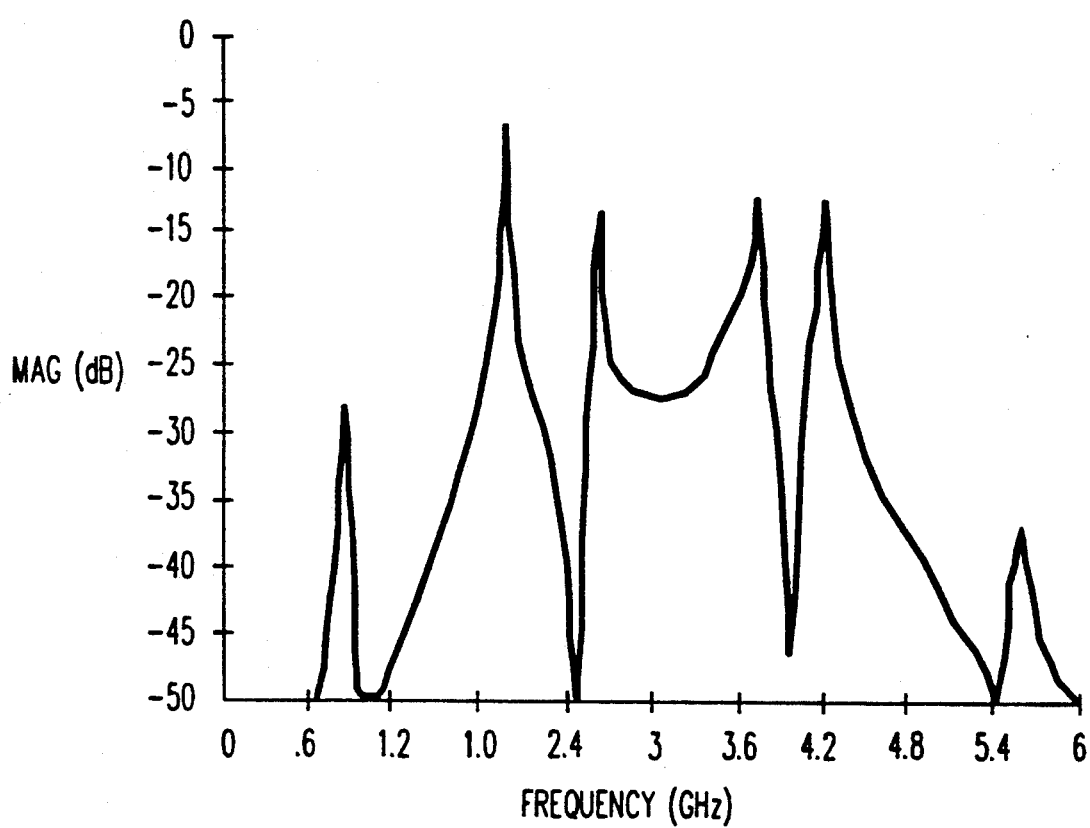
FIG. 8 shows the response of a typical filter built in accordance with this invention.

FBAR's constructed in accordance with this invention are operable at frequencies well into the gigahertz range. A stacked FBAR as shown in FIG. 3A, and having a silicon substrate, a 2½ micron thick silicon oxide insulating membrane, approximately 3000Å±200Å thick ZnO films, and approximately 900Å thick CrAn contact layers was determined to be resonant at frequencies up to approximately 5.5 GHz. This monolithic device requires no wire bond connections, and is therefore more conveniently modeled for computer simulations. FIG. 8 shows a typical filter response. The insertion loss for this filter at 1.98 GHz (second harmonic) is 6.5 dB. The out-of-band responses are clean, and the filter bandwidth is about 50 MHz (2%). These results are for a structure using an amorphous $SiO_2$ layer; a low-loss single crystal membrane layer should improve the performance considerably. The performance of this device is more fully described in a presentation to the December 1990 IEEE Ultrasonics Symposium by S. V. Krishnaswamy, J. Rosenbaum, S. Horwitz, C. Vale and R. A. Moore, entitled *Film Bulk Acoustic Wave Resonator Technology*.

Having this shown and described what is considered to be the preferred embodiment for implementing this invention, it is noted that the same has been made by way of illustration and not limitation. Accordingly, all modifications, alterations and changes coming within the spirit and scope of the invention are herein meant to be included.

We claim as our invention:

1. A device comprising:
   a semiconductor substrate having an opening formed therein;
   a bottom piezoelectric layer disposed on said substrate and spanning said opening;
   a first transmission line disposed on said substrate and having a section thereof extending under said bottom piezoelectric layer opposed said opening;
   a second transmission line disposed on said substrate and having a section thereof extending over said bottom piezoelectric layer opposed said opening;
   a first conductive layer disposed on said substrate, said first conducting layer comprising a ground plane coplanar with sections of said first transmission line and said second transmission line disposed on said substrate;
   an insulating membrane disposed over said substrate, said first transmission line, said second transmission line, said first piezoelectric layer, and said first conductive layer;
   a second conductive layer disposed on said insulating membrane;
   a second piezoelectric layer disposed on said second conductive layer opposed said opening; and
   a third transmission line disposed on said insulating membrane and having a section thereof extending over said second piezoelectric layer comprises a ground plane coplanar with that portion of said third transmission line disposed on said insulating membrane.

2. A device as in claim 1, further comprising a conductive via disposed through said insulating membrane and operable to connect said first conductive layer to said second conductive layer.

3. A film bulk acoustic resonator comprising:
   a piezoelectric layer disposed on a substrate and spanning an opening in said substrate;
   a transmission line disposed on said substrate and connected to said piezoelectric layer; and
   a conductive layer disposed on said substrate, wherein said conductive layer comprises a ground plane coplanar with said transmission line;
   further comprising said piezoelectric layer having a first piezoelectric portion and a second piezoelectric portion, and
   further comprising said conductive layer extending to realize a shielding layer between said first and second piezoelectric portions.

4. A device comprising:
   a resonator structure disposed over an opening in a substrate, said resonator structure comprising a first piezoelectric layer disposed on said substrate, an insulating membrane disposed on said first piezoelectric layer, and a second piezoelectric layer disposed on said insulating membrane;
   a first transmission line disposed on said substrate and having a portion thereof extending under said first piezoelectric layer opposed said opening;
   a second transmission line disposed on said substrate and having a portion thereof extending between said first piezoelectric layer and said insulating membrane opposed said opening;
   a first conductive layer disposed on said substrate, said first conductive layer comprising a ground plane coplanar with those portions of said first transmission line and said second transmission line disposed on said substrate;
   a third transmission line disposed on said insulating membrane and having a portion thereof extending over said second piezoelectric layer opposed said opening; and a second conductive layer disposed on said insulating membrane, said second conductive layer comprising a ground plane coplanar with that portion of said third transmission line disposed on said insulating member.

5. A device as in claim 4, further comprising a conductive via disposed through said insulating membrane and operable to connect said first conductive layer to said second conductive layer.

6. A device comprising:
a substrate having an opening formed therein;
an insulating layer disposed on said substrate and spanning said opening;
a transmission line disposed on said insulating layer and having a section thereof opposed said opening;
a piezoelectric layer disposed on said transmission line opposed said opening; and
a conductive layer disposed on said insulating layer, said conductive layer having a portion thereof extending over said piezoelectric layer to form a ground connection, said conductive layer further comprising a ground plane coplanar with that portion of said transmission line disposed on said insulating layer.

7. A device comprising:
a substrate having an opening formed therein;
a piezoelectric layer disposed on said substrate and spanning said opening;
a transmission line disposed on said substrate and having a section thereof extending under said piezoelectric layer opposed said opening; and
a conductive layer disposed on said substrate, said conductive layer having a portion thereof extending over said piezoelectric layer to form a ground connection, said conductive layer further comprising a ground plane coplanar with that portion of said transmission line disposed on said substrate.

8. A device comprising:
a substrate having an opening formed therein;
an insulating layer disposed on said substrate and spanning said opening;
a bottom piezoelectric layer disposed on said insulating layer opposed said opening;
a first transmission line disposed on said insulating layer and having a section thereof extending under said bottom piezoelectric layer opposed said opening;
a conductive shielding layer disposed on said bottom piezoelectric layer;
a top piezoelectric layer disposed on said shielding layer;
a second transmission line disposed on said insulating layer and having a section thereof extending onto said top piezoelectric layer; and
a conductive layer disposed on said insulating layer, said conductive layer having a portion thereof extending to connect with said shielding layer, said conductive layer comprising a ground plane coplanar with sections of said first transmission line and said second transmission line disposed on said insulating layer.

9. A device comprising:
a substrate having an opening formed therein;
a bottom piezoelectric layer disposed on said substrate and spanning said opening;
a first transmission line disposed on said substrate and having a section thereof extending under said bottom piezoelectric layer opposed said opening;
a conductive shielding layer disposed on said bottom piezoelectric layer;
a top piezoelectric layer disposed on said shielding layer;
a second transmission line disposed on said substrate and having a section thereof extending onto said top piezoelectric layer; and
a conductive layer disposed on said substrate, said conductive layer having a portion thereof extending to connect with said shielding layer, said conductive layer comprising a ground plane coplanar with sections of said first transmission line and said second transmission line disposed on said substrate.

10. A filter bank comprising:
a substrate having a plurality of openings formed therein; and
a plurality of resonators respectively disposed over corresponding ones of said openings, each resonator comprising;
a bottom piezoelectric layer disposed on said substrate and spanning a corresponding one of said openings;
a first transmission line disposed on said substrate and having a section thereof extending under said bottom piezoelectric layer and opposed said corresponding opening;
a second transmission line disposed on said substrate and having a section thereof extending over said bottom piezoelectric layer opposed said corresponding opening;
a first conductive layer disposed on said substrate, said first conducting layer comprising a ground plane coplanar with sections of said first transmission line and said second transmission line disposed on said substrate;
an insulating membrane disposed over said substrate, said first transmission line, said second transmission line, said first piezoelectric layer, and said first conductive layer;
a second conductive layer disposed on said insulating membrane;
a second piezoelectric layer disposed on said second conductive layer opposed said corresponding opening; and
a third transmission line disposed on said insulating membrane and having a section thereof extending over said second piezoelectric layer opposed said corresponding opening, wherein, said second conductive layer comprises a ground plane coplanar with that portion of said third transmission line disposed on said insulating membrane;
wherein said first and second transmission lines of said resonators are operatively connected to realize a series manifold filter circuit.

11. A filter bank as described in claim 10, further comprising a conductive via formed through said insulating membrane of at least one said resonator and operable to connect said first conductive layer to said second conductive layer.

12. A filter bank as described in claim 10, further comprising;
said second transmission line of a first resonator and said first transmission line of a second resonator comprising a single transmission line; and
said first conductive layers of said first resonator and said second resonator comprising a single ground plane.

* * * * *